(12) United States Patent
Zhou

(10) Patent No.: US 9,136,171 B2
(45) Date of Patent: Sep. 15, 2015

(54) INTERCONNECT STRUCTURE AND FABRICATION METHOD

(71) Applicant: Semiconductor Manufacturing International (Shanghai) Corporation, Shanghai (CN)

(72) Inventor: Ming Zhou, Shanghai (CN)

(73) Assignee: SEMICONDUCTOR MANUFACTURING INTERNATIONAL (SHANGHAI) CORPORATION, Shanghai (CN)

(*) Notice: Subject to any disclaimer, the term of this patent is extended or adjusted under 35 U.S.C. 154(b) by 140 days.

(21) Appl. No.: 14/038,789

(22) Filed: Sep. 27, 2013

(65) Prior Publication Data

US 2014/0167285 A1      Jun. 19, 2014

(30) Foreign Application Priority Data

Dec. 18, 2012   (CN) .......................... 2012 1 0553292

(51) Int. Cl.
| | | |
|---|---|---|
| *H01L 23/522* | (2006.01) | |
| *H01L 21/768* | (2006.01) | |
| *H01L 23/532* | (2006.01) | |

(52) U.S. Cl.
CPC ...... *H01L 21/76898* (2013.01); *H01L 21/7682* (2013.01); *H01L 21/76802* (2013.01); *H01L 21/76835* (2013.01); *H01L 23/5222* (2013.01); *H01L 23/5329* (2013.01); *H01L 23/53295* (2013.01); *H01L 2221/1047* (2013.01)

(58) Field of Classification Search
CPC . H01L 23/522; H01L 21/768; H01L 23/5222; H01L 23/5329; H01L 23/53295; H01L 21/76802; H01L 21/7682; H01L 21/76835; H01L 21/76898
USPC .......................................... 257/774; 438/618
See application file for complete search history.

(56) References Cited

U.S. PATENT DOCUMENTS

| | | | |
|---|---|---|---|
| 7,279,427 B2 | 10/2007 | Nishino et al. | |
| 2005/0101119 A1* | 5/2005 | Li et al. | ........................ 438/624 |

* cited by examiner

*Primary Examiner* — Selim Ahmed

(74) *Attorney, Agent, or Firm* — Anova Law Group, PLLC

(57) ABSTRACT

An interconnect structure and fabrication method are provided. A substrate can include a semiconductor device disposed in the substrate. At least two porous films can be formed over the substrate and can include a first porous film having a first pore size, and a second porous film having a second pore size formed on the first porous film. The first porous size and the second porous size are different. The interconnect can be formed through the plurality of porous films to provide electrical connection to the semiconductor device in the substrate.

20 Claims, 4 Drawing Sheets though the porous film containing pores may provide low dielectric constant, the porous film may have weak mechanical strength due to great amount of pores with a hollow structure in the film. The porous film tends to be damaged when an external force is exerted to the porous film, e.g., in a chemical mechanical planarization process.

INTERCONNECT STRUCTURE AND FABRICATION METHOD

CROSS-REFERENCES TO RELATED APPLICATIONS

This application claims the priority to Chinese Patent Application No. CN201210553292.2, filed on Dec. 18, 2012, which is incorporated herein by reference in its entirety.

FIELD OF THE INVENTION

The present disclosure generally relates to the field of semiconductor manufacturing technology and, more particularly, relates to an interconnect structure and methods for making the same.

BACKGROUND

Currently, one of the challenges of integrated circuit design and manufacturing is to reduce resistive capacitive delay during signal transmission. One solution is to replace an aluminum layer with a copper layer to lower the serial metal resistance. Another solution is to form low-k porous films or air gaps between the metal layers to reduce the parasitic capacitance.

FIG. 1 shows a conventional method for fabricating an interconnect structure. The fabrication method includes: providing a substrate 5 and forming semiconductor devices on the substrate 5; depositing a low-k film 4 on the substrate 5; forming a mask 6 on the low-k film 4; patterning the low-k film 4 using the mask 6 to create through-holes (not illustrated); and filling the through-holes with metal to create an interconnect structure connecting to the semiconductor devices. Specifically, the low-k film 4 is porous and the mask 6 is a hard mask.

The porous film contains pores with a dielectric constant of 1, which is lower than the dielectric constant of material surrounding the pores, offering the porous film a lower dielectric constant. In a practical process, however, mechanical strength of the interconnect structure inside the porous film is found weak. The porous film tends to be damaged during subsequent processes (e.g., including a chemical mechanical planarization to remove excessive metal), thus lowering the manufacturing yield of the interconnect structure.

BRIEF SUMMARY OF THE DISCLOSURE

One aspect of present disclosure includes a method for forming an interconnect structure. A substrate is provided including a semiconductor device disposed in the substrate. A plurality of porous films can then be formed over the substrate. The plurality of porous films include a first porous film having a first pore size, and a second porous film having a second pore size formed on the first porous film. The first porous size and the second porous size are different. An interconnect can be formed through the plurality of porous films to provide electrical connection to the semiconductor device.

Another aspect of present disclosure includes an interconnect structure having a substrate with a semiconductor device disposed thereon. A plurality of porous films can be disposed over the substrate. The plurality of porous films can include a first porous film having a first pore size, and a second porous film having a second pore size formed on the first porous film. The first porous size and the second porous size can be different. An interconnect can be disposed through the plurality of porous films to provide electrical connection to the semiconductor device.

As disclosed, at least two porous films are provided to have a first porous film and a second porous film with pore sizes sufficiently different, e.g., containing small-sized pores and large-sized pores. With respect to large pores, small pores can support greater external force to improve mechanical strength of the porous films. Meanwhile, the combination of large pores and small pores in the at least two porous films can provide a lower dielectric constant required for the porous films.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

As discussed, although the porous film containing pores may provide low dielectric constant, the porous film may have weak mechanical strength due to great amount of pores with a hollow structure in the film. The porous film tends to be damaged when an external force is exerted to the porous film, e.g., in a chemical mechanical planarization process.

Accordingly, the present disclosure provides a method for fabricating an interconnect structure. For example, multiple porous films can be formed over a substrate. In one embodiment, formation of porous films includes forming a first porous film on the substrate and forming a second porous film on the first porous film, such that the pore size of the second porous film is different from the pore size of the first porous film. A hard mask is then formed on the porous films. It should be noted that the pore size of the first and second porous films refers to an inner diameter or width of pores contained inside corresponding porous films.

Porous films made up of a first and a second porous films with sufficiently different pore sizes contain not only large pores but also small pores (e.g., the pore size of the second porous film is smaller than the pore size of the first porous film). In contrast, the porous film in the existing technology contains only large pores. As disclosed, the small pores can endure a greater external force compared to the large pores. In addition, the combination of small pores and large pores can provide desired low dielectric constant for the porous films, while the small pores can improve the mechanical strength of the porous films.

FIGS. 2-9 are schematics for an exemplary method for forming an interconnect structure in accordance with various disclosed embodiments.

Figure 1:
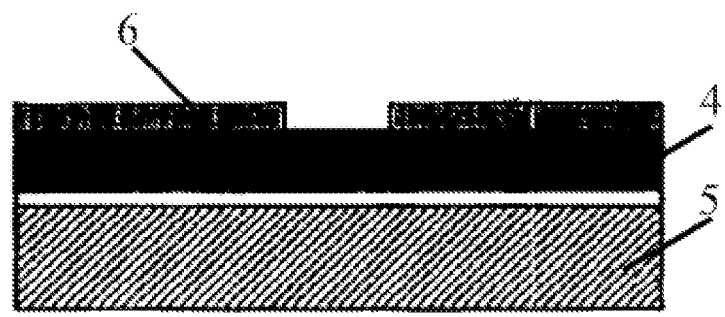
FIG. 1 is a schematic of a conventional fabrication method for an interconnect structure.
Figure 2:
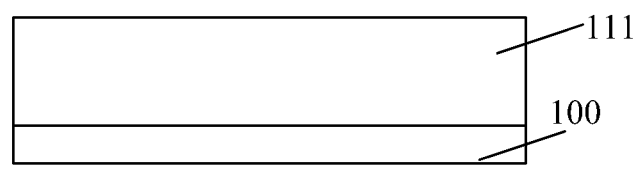
FIGS. 2-9 are schematics for an exemplary method for forming an interconnect structure in accordance with various disclosed embodiments.

As shown in FIG. 2, a substrate 100 is provided. In one embodiment, the substrate 100 includes a support base on which semiconductor devices are formed (e.g., transistors); a metal layer formed on the support base and the semiconductor devices, and a blocking layer formed on the metal layer. The metal layer may be electrically connected to other devices through an interconnect structure. And the blocking layer is used to prevent metal diffusion from the metal layer. For example, the metal layer is made of copper and/or aluminum, and the block layer is made of nitrogen-doped silicon carbide (NDC). The materials used for making the metal layer and the blocking layer, however, are not limited.

Figure 3:
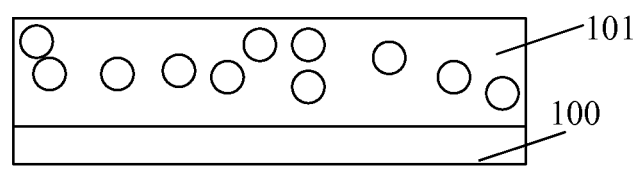

Referring to FIGS. 2 and 3, a first film 111 is formed on the substrate 100, and is treated (e.g., ultraviolet light (UV) treated) to form a first porous film 101. In this exemplary embodiment, the first film 111 is formed by dimethyldiethoxysilane and atom transfer radical polymerization. For example, a sol-gel process can be employed to form the first film 111 on the substrate 100. In other embodiments, the first film 111 can be made of $SiO_2$, SiOF, SiCOH, SiO, SiCO, SiCON, and/or black diamond(s). A chemical vapor deposition process can be used to deposit the first film 111. The materials and methods used for making the first film 111 are not limited.

The first film 111 is used to form the first porous film 101. In one embodiment, a pore size of the first porous film 101 is larger than a pore size of a second porous film to be subsequently formed over the first porous film 101. Accordingly, in one example, a ratio of dimethyldiethoxysilane to atom transfer radical polymerization ranges from about 1:1.2 to about 1:1.7 during formation of the first porous film 101, such that atom transfer radical polymerization as a foam agent has a large proportion to form desired larger pores. As shown in FIG. 3, a porous structure is developed in the first film 111 to form the first porous film 101, e.g., by heat generated by the UV treatment of the first film 111.

It should be noted that, the larger the pore size, the lower the dielectric constant; and the smaller the pore size, the higher the dielectric constant, when all the parameters other than the pore size are the same. In some cases the pore size of the first porous film 101 may be too large, the force supported by the porous film 101 can be too small. In other cases the pore size of the first porous film 101 may be too small, the dielectric constant of the porous films can be too high. Thus, the pore size of the first porous film 101 can be determined, e.g., ranging from about 7 nm to about 9 nm. However, the pore size of the first porous film 101 is not limited.

Figure 4:
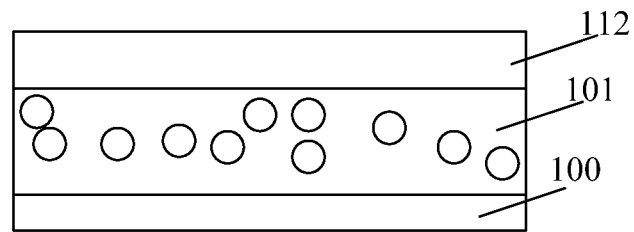
Figure 5:
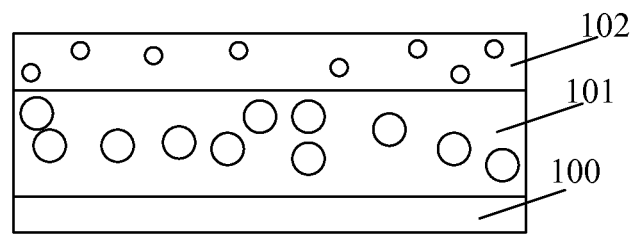

Referring to FIGS. 4 and 5, a second film 112 is formed on the first porous film 101 and is then treated (e.g., UV-treated) to form a second porous film 102. In this embodiment, the second film 112 is made of a same material as the first film 111, to provide a desired bonding between the second film 112 and the first porous film 101 to improve film quality. The material used for forming the second film 112 is not limited.

In one embodiment, the fabrication process for the second film 112 can be a same process used for forming the first film 111. For example, a sol-gel process is employed to form the second film 112 over the first porous film 101, such that pore sizes of the first and second porous films can be controlled as desired. The process used for forming the second film 112 is not limited.

In one example, a ratio of dimethyldiethoxysilane to atom transfer radical polymerization ranges from about 1:0.5 to about 1:1 during the formation of the second porous film 102, such that atom transfer radical polymerization as a foam agent has a small proportion to form small pores. In some cases the pore size of the second porous film 102 may be too large, the mechanical strength of the porous films cannot be effectively enhanced. In other cases the pore size of the second porous film 102 may be too small, the dielectric constant of the porous films cannot be sufficiently reduced. In one embodiment, the pore size of the second porous film 102 ranges from about 3 nm to about 6 nm. However, the pore size of the second porous film 102 is not limited.

It should be noted that if the pore size difference between the second porous film 102 and the first porous film 101 is too big, the capacity of the porous films to endure external force can be reduced due to the overly-large pore size of the first porous film 101. In some cases when the pore sizes of the first porous film 101 and second porous film 102 are close to each other, less degree of improvement in mechanical strength for the porous films may occur. Therefore, in one embodiment, the pore size of the first porous film can be chosen to be about 1.1 to about 5 times the pore size of the second porous film. In practice, the pore size ratio between the first porous film 101 and the second porous film 102 can be obtained based on desired dielectric constant of the porous films. This improves degree of freely designing the porous films.

For example, the first porous film 101 with a large pore size has a lower dielectric constant while the second porous film 102 with a small pore size has a higher dielectric constant, so the first porous film 101 can be made thicker than the second porous film 102 to obtain ultra low-k porous films with a low dielectric constant due to the large proportion of the first porous film 101 in the whole porous films. In practice, the thickness ratio between the first porous film 101 and the second porous film 102 can be obtained based on a desired dielectric constant for the porous films. This improves degree of freely designing the porous films.

Although in one embodiment the second porous film 102 is thinner than the first porous film 101, the thickness of the second porous film 102 with respect to the first porous film 101 is not limited in accordance with various embodiments. In other embodiments, the second porous film 102 may be thicker than the first porous film 101. In addition, the thickness of the second porous film 102 may also be the same as the thickness of the first porous film 101 although the second porous film 102 can be formed to have a different thickness from the first porous film 101.

Figure 6:
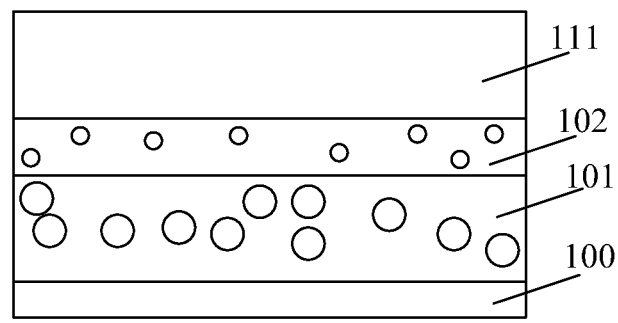
Figure 7:
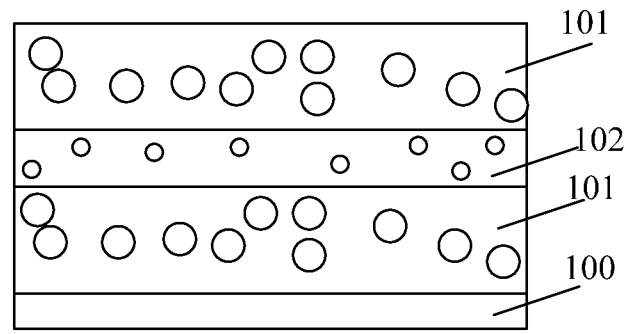
Figure 8:
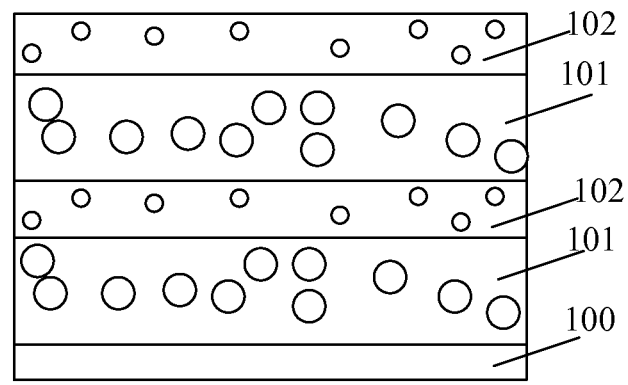

Referring to FIGS. 6 and 7, additional files such as a second first-film 111 is formed on the second porous film 102 and is then treated to form a second first-porous-film 101 on the second porous film 102. Referring to FIG. 8, a second second-porous-film 102 is formed on second first-porous-film 101, such that porous films can be generated by alternatingly stacking the first porous film 101 and second porous film 102. Any desired number of the alternatingly stacked first porous film 101 and second porous film 102 can be included.

Figure 9:
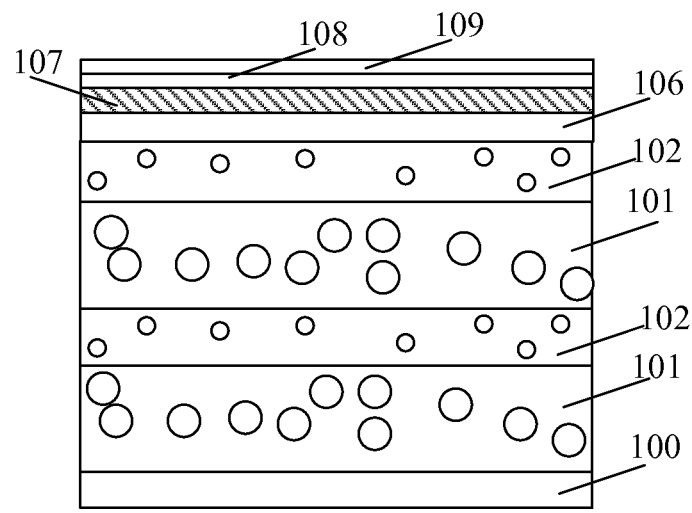

As shown in FIG. 9, a hard mask is formed on the porous films including alternatingly stacked the first porous film 101 and second porous film 102. For example, the process of forming the hard mask includes forming a hard mask 106, a TEOS hard mask 107 formed on the hard mask 106, a metal hard mark 108 formed on the TEOS hard mask 107, and a silicon oxide layer 109 formed on the metal hard mark 108. In other embodiments, however, different masks can be formed based on a specific desired structure without limitation.

In this manner, the porous films are formed on the substrate 100 by alternatingly stacking the first porous film 101 and the second porous film 102 without limitation. In one example, the porous films may include one porous film 101 and one porous film 102. In another example, the number of the first porous film 101 can be different than the number of the second porous film 102 in the porous films. For example, the porous films can be formed on the substrate by forming the first porous film 101, the second porous film 102, and another layer of the first porous film 101. Note that although the porous films can be formed on the substrate by forming the second porous film 102 first and then forming the first porous film 101 on the second porous film 102, the order and number of forming the first and second porous films are not limited.

In some embodiments, the pore size of the first porous film 101 is larger than the pore size of the second porous film 102. In other embodiments, the pore size of the first porous film 101 can be smaller than the pore size of the second porous film 102.

In various embodiments, a hard mask layer can be formed on the porous films to form an interconnect through the plurality of porous films to provide electrical connection between the semiconductor device and other devices. For example, the hard mask can be patterned and used as an etch mask to form a through-hole through the plurality of porous films, the barrier layer in the substrate 100, and/or the metal layer in the substrate 100 by suitable etching process(es) to expose the metal layer in the substrate 100. The through-hole can then be filled with metal material to form the electrical interconnection between semiconductor devices.

Figure 10:
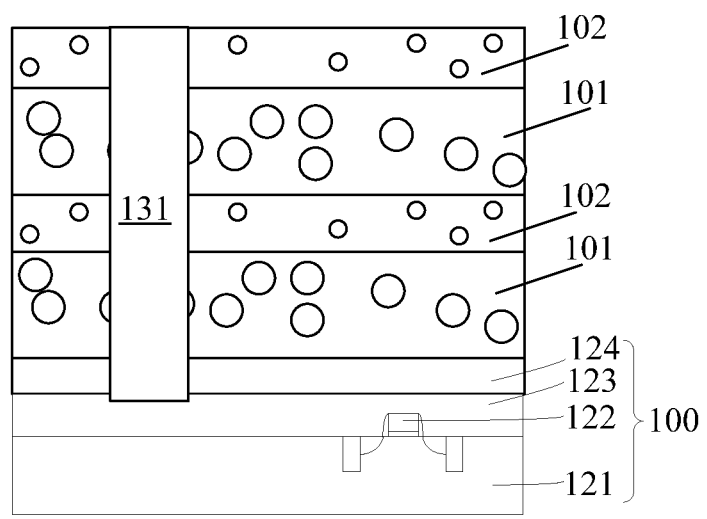
FIG. 10 is a schematic showing an interconnect structure in accordance with various disclosed embodiments.

Various embodiments provide an exemplary interconnect structure. FIG. 10 depicts an exemplary interconnect structure including a substrate 100 and porous films on the substrate. The substrate 100 contains a support base 121 on which semiconductor devices 122 (e.g., a transistor) are disposed, a metal layer 123 disposed on the support base 121 and the semiconductor devices 122, and a block layer 124 disposed on the metal layer 123. The metal layer 123 is electrically connected to other devices through an interconnect 131 formed in this embodiment, and the block layer 124 is used to prevent diffusion of metal from the metal layer 123. In one embodiment, the metal layer is made of copper or aluminum, and the block layer is made of nitrogen-doped silicon carbide. However, the materials used for respectively forming the metal layer 123 and the block layer 124 are not limited.

In one embodiment, the porous films contain the first porous film 101 on the substrate 100 and the second porous film 102 on the first porous film 101. In this case, the pore size of the second porous film 102 is smaller than the pore size of the first porous film 101. In other embodiments, the pore size of the second porous film 102 may be larger than the pore size of the first porous film 101. The smaller pores of a porous film can support greater external force on the porous film and improve mechanical strength of the porous film, resulting in enhancement in the mechanical strength of the interconnect formed there-through.

In another embodiment, the porous films include the first porous film 101 and the second porous film 102 which are alternatingly stacked. For example, the interconnect structure can be formed through porous films including a first first-porous-film 101, a first second-porous-film 102, a second first-porous-film 101, a second second-porous-film 102, any additional first-porous-film 101, and any additional second-porous-film 102 formed on the substrate 100. In some cases, the porous films can have a number of the first porous film 101 different from the number of the second porous film 102 in the porous films.

For example, the first porous film 101 with large pores has a low dielectric constant but is weak in supporting external force; while the second porous film 102 with small pores has a high dielectric constant but is strong in supporting external force. In one embodiment, the pore size of the first porous film 101 ranges from about 1.1 to about 5 times the pore size of the second porous film 102.

In some embodiments, the second porous film 102 is thinner than the first porous film 101. In other embodiments, the second porous film 102 can be thicker than the first porous film 101. In yet other embodiments, the second porous film 102 may have a same thickness as the first porous film 101.

In practice, the quantity, thickness, and/or pore size of the first porous film(s) 101 and the second porous film(s) 102 can be adjusted according to requirements of mechanical strength and dielectric constant for the porous films. As used herein, the term "pore size" may refer to an average pore size of a corresponding porous film or a certain pore size of the corresponding porous film. A porous film may have a fixed pore size for all pores therein or may have a distribution of pore sizes in the porous film.

The interconnect structure can be generated by the fabrication method as disclosed herein, although other fabrication methods may be used to form desired interconnect structure, without limitation. In some embodiments, the interconnect structure can include plugs (not illustrated) formed inside the porous films.

Other applications, advantages, alternations, modifications, or equivalents to the disclosed embodiments are obvious to those skilled in the art.

What is claimed is:

1. A method for forming an interconnect structure comprising:
    providing a substrate comprising a semiconductor device disposed therein;
    forming a plurality of porous films over the substrate, wherein the plurality of porous films comprise a first porous film having a first pore size and a second porous film having a second pore size formed on the first porous film, and formed by:
        forming a first film over the substrate by a first sol-gel process including an atom transfer radical as a foam agent, followed by an ultraviolet light treatment to form the first porous film having the first pore size, and
        forming a second film on the first porous film by a second sol-gel process including the atom transfer radical, followed by an ultraviolet light treatment to form the second porous film having the second pore size, and wherein the first porous size and the second porous size are different; and
    forming an interconnect through the plurality of porous films to provide electrical connection to the semiconductor device.

2. The method of claim 1, further comprising forming a hard mask on the plurality of porous films prior to forming the interconnect.

3. The method of claim 1, wherein the second pore size of the second porous film is larger than the first pore size of the first porous film.

4. The method of claim 1, wherein the plurality of porous films comprises a plurality of first porous films and a plurality of second porous films, wherein the first porous film and the second porous film are alternatingly stacked to form the plurality of porous films.

5. The method of claim 1, wherein the plurality of porous films comprises a number of the first porous film and a different number of the second porous film.

6. The method of claim 1, wherein the first porous film and the second porous film have a same thickness.

7. The method of claim 1, wherein the first porous film and the second porous film have a different thickness.

8. The method of claim 1, wherein the first pore size of the first porous film ranges from about 1.1 to about 5 times the second pore size of the second porous film.

9. The method of claim 1, further comprising using dimethyldiethoxysilane in each of the first and second sol-gel processes.

10. The method of claim 9, wherein a ratio of the diethoxymethylsilane to the atom transfer radical ranges from about 1:1.2 to about 1:1.7 for forming the first porous film.

11. The method of claim 9, wherein a ratio of the diethoxymethylsilane to the atom transfer radical ranges from about 1:0.5 to about 1:1 for forming the second porous film.

12. The method of claim 1, wherein the first porous film and the second porous film are made of a same material.

13. The method of claim 1, further comprising forming the interconnect all way through the plurality of porous films to provide electrical connection to the semiconductor device.

14. An interconnect structure comprising:
a substrate comprising a semiconductor device disposed therein;
a plurality of porous films disposed over the substrate, wherein the plurality of porous films comprise a first porous film having a first pore size, and a second porous film having a second pore size formed on the first porous film, formed by: forming a first film over the substrate by a first sol-gel process including an atom transfer radical as a foam agent, followed by an ultraviolet light treatment to form the first porous film having the first pore size, and forming a second film on the first porous film by a second sol-gel process including the atom transfer radical, followed by an ultraviolet light treatment to form the second porous film having the second pore size, and wherein the first porous size and the second porous size are different; and
an interconnect disposed through the plurality of porous films to provide electrical connection to the semiconductor device.

15. The structure of claim 14, wherein the second pore size of the second porous film is smaller than the first pore size of the first porous film.

16. The structure of claim 14, wherein the plurality of porous films comprises a plurality of first porous films and a plurality of second porous films, wherein the first porous film and the second porous film are alternatingly stacked to form the plurality of porous films.

17. The structure of claim 14, wherein the plurality of porous films comprises a number of the first porous film and a different number of the second porous film.

18. The structure of claim 14, wherein the first porous film and the second porous film have a different thickness, and are made of a same material.

19. The structure of claim 14, wherein the first pore size of the first porous film ranges from about 1.1 to about 5 times the second pore size of the second porous film.

20. The structure of claim 14, wherein the interconnect is disposed all way through the plurality of porous films to provide electrical connection to the semiconductor device.

* * * * *